US009202856B2

(12) United States Patent
Kang et al.

(10) Patent No.: US 9,202,856 B2
(45) Date of Patent: Dec. 1, 2015

(54) ORGANIC LIGHT EMITTING DIODE DISPLAY DEVICE AND METHOD OF MANUFACTURING THE SAME

(71) Applicant: Samsung Display Co., Ltd., Yongin, Gyeonggi-Do (KR)

(72) Inventors: Shin-Moon Kang, Yongin (KR);
Jong-Hyun Choi, Yongin (KR);
Byung-Soo So, Yongin (KR);
Yong-Duck Son, Yongin (KR);
Jin-Wook Seo, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 27 days.

(21) Appl. No.: 14/065,085

(22) Filed: Oct. 28, 2013

(65) Prior Publication Data

US 2014/0346460 A1 Nov. 27, 2014

(30) Foreign Application Priority Data

May 23, 2013 (KR) .......................... 10-2013-0058540

(51) Int. Cl.
*H01L 27/32* (2006.01)
*H01L 51/56* (2006.01)
*H01L 27/12* (2006.01)

(52) U.S. Cl.
CPC .......... *H01L 27/3279* (2013.01); *H01L 27/124* (2013.01); *H01L 27/3248* (2013.01)

(58) Field of Classification Search
USPC .................. 257/40, 59, 72, E51.018, E51.019
See application file for complete search history.

(56) References Cited

U.S. PATENT DOCUMENTS

| 8,604,468 | B1 * | 12/2013 | Choi et al. | 257/40 |
| 8,698,189 | B2 * | 4/2014 | Park et al. | 257/99 |
| 8,796,768 | B2 * | 8/2014 | You | 257/347 |
| 8,866,145 | B2 * | 10/2014 | Choi et al. | 257/72 |
| 8,878,198 | B2 * | 11/2014 | Choi et al. | 257/79 |
| 8,901,563 | B2 * | 12/2014 | Park et al. | 257/59 |
| 8,952,386 | B2 * | 2/2015 | You et al. | 257/71 |
| 9,000,523 | B2 * | 4/2015 | Choi et al. | 257/350 |
| 9,012,890 | B2 * | 4/2015 | You et al. | 257/40 |
| 9,012,915 | B2 * | 4/2015 | Oh et al. | 257/59 |

(Continued)

FOREIGN PATENT DOCUMENTS

| KR | 1019930000644 | 1/1993 |
| KR | 10-2006-60124630 A | 10/2006 |

(Continued)

*Primary Examiner* — Ida M Soward
(74) *Attorney, Agent, or Firm* — Knobbe, Martens, Olson & Bear LLP

(57) ABSTRACT

An organic light emitting diode display device is disclosed. The device includes, for example, a thin film transistor with an active layer on a substrate, a gate electrode, a source electrode, and a drain electrode, a pixel electrode formed on the same layer as the gate electrode, an electrode pattern partially exposing the pixel electrode and formed on the pixel electrode, a pixel electrode contact formed between the electrode pattern and the drain electrode and electrically connected to the drain electrode, a pixel defining film exposing the pixel electrode and formed to cover the drain electrode and the source electrode, an intermediate layer formed on the exposed pixel electrode and including an emissive layer, and an opposite electrode formed opposite the pixel electrode to at least partially cover the intermediate layer. A method of manufacturing the device is also disclosed.

15 Claims, 10 Drawing Sheets

(56) References Cited

U.S. PATENT DOCUMENTS

| | | | |
|---|---|---|---|
| 2010/0193790 A1* | 8/2010 | Yeo et al. | 257/59 |
| 2011/0108848 A1* | 5/2011 | Lee et al. | 257/72 |
| 2011/0309339 A1* | 12/2011 | You et al. | 257/40 |
| 2012/0074414 A1* | 3/2012 | Lee et al. | 257/59 |
| 2012/0104396 A1* | 5/2012 | Pyo | 257/59 |
| 2012/0132916 A1* | 5/2012 | Jung | 257/59 |
| 2012/0286281 A1* | 11/2012 | You | 257/72 |
| 2013/0001602 A1* | 1/2013 | Park et al. | 257/88 |
| 2013/0015456 A1* | 1/2013 | You | 257/71 |
| 2013/0026475 A1* | 1/2013 | Choi et al. | 257/59 |
| 2013/0037817 A1* | 2/2013 | Lee et al. | 257/71 |
| 2013/0119387 A1* | 5/2013 | Park et al. | 257/59 |
| 2013/0146878 A1* | 6/2013 | Oh et al. | 257/59 |
| 2013/0153914 A1* | 6/2013 | You et al. | 257/72 |
| 2013/0228786 A1* | 9/2013 | Park | 257/72 |
| 2013/0285996 A1* | 10/2013 | Lee et al. | 345/211 |
| 2013/0293236 A1* | 11/2013 | Lee et al. | 324/414 |
| 2013/0300966 A1* | 11/2013 | Jin et al. | 349/43 |
| 2014/0014913 A1* | 1/2014 | Lee | 257/40 |
| 2014/0027720 A1* | 1/2014 | Kim et al. | 257/40 |
| 2014/0027726 A1* | 1/2014 | Choi et al. | 257/40 |
| 2014/0042394 A1* | 2/2014 | Lee | 257/40 |

FOREIGN PATENT DOCUMENTS

| | | |
|---|---|---|
| KR | 10-2011-0003723 A | 1/2011 |
| KR | 10-2012-0075040 A | 7/2012 |

* cited by examiner

ORGANIC LIGHT EMITTING DIODE DISPLAY DEVICE AND METHOD OF MANUFACTURING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. For example, this application claims the benefit of Korean Patent Application No. 10-2013-0058540, filed on May 23, 2013, in the Korean Intellectual Property Office, the disclosure of which is incorporated herein in its entirety by reference.

BACKGROUND

1. Field

The present disclosure relates to an organic light emitting diode display device and a method of manufacturing the same, and more particularly, to an organic light emitting display device having excellent response characteristics and a method of manufacturing the same.

2. Description of the Related Technology

An organic light emitting diode display is a self-emissive display device that generally includes a hole injection electrode, an electron injection electrode, and an organic light emitting layer formed therebetween. In the organic light emitting diode display device, light is generated as holes from an anode and electrons from a cathode recombine in the organic light emitting layer to an excited state that gradually decays thereafter. The organic light emitting diode has high-grade characteristics such as low power consumption, high luminance, and high response speed, and thus, has received attention as a next-generation display device for a mobile electronic device. However, in the case of a large-sized panel, it is necessary to reduce a wiring resistance in order to make the organic light emitting diode display have a relatively high response speed.

SUMMARY OF CERTAIN INVENTIVE ASPECTS

In one aspect, an organic light emitting diode display is provided. In some embodiments, the organic light emitting diode display is capable of preventing an IR drop and achieving a relatively fast response characteristic when compared to conventional devices.

In another aspect, a method of manufacturing an organic light emitting diode display is provided.

In another aspect, an organic light emitting diode display device includes, for example, a substrate, a thin film transistor having an active layer on the substrate, a gate electrode, a source electrode, and a drain electrode, a pixel electrode formed in the same layer as the gate electrode, an electrode pattern partially exposing the pixel electrode and formed on the pixel electrode, a pixel electrode contact formed between the electrode pattern and the drain electrode and electrically connected to the drain electrode; a pixel defining film exposing the pixel electrode and formed to cover the drain electrode and the source electrode, an intermediate layer formed on the exposed pixel electrode and including an emissive layer, and an opposite electrode formed opposite the pixel electrode and covering the intermediate layer.

In some embodiments, the pixel electrode contact may contact an upper part of the electrode pattern and a lower part of the drain electrode. In some embodiments, the drain electrode, the source electrode, and the pixel electrode contact may be formed from the same material. In some embodiments, the pixel electrode contact may have a laminated structure of molybdenum/aluminum/molybdenum (Mo/Al/Mo). In some embodiments, a sum of thicknesses of the pixel electrode contact and the drain electrode on the electrode pattern may be greater than the thickness of the drain electrode on the active layer. In some embodiments, the organic light emitting diode display device may further include an auxiliary layer disposed between the substrate and the active layer.

In some embodiments, the organic light emitting diode display device may further include a capacitor having a lower electrode formed in the same layer as the gate electrode, an upper electrode formed in the same layer as the drain electrode and the source electrode by using the same material, a first lower electrode contact formed in the same layer as the upper electrode and electrically connected to the lower electrode, and a second lower electrode contact formed on the first lower electrode contact. In some embodiments, a sum of thicknesses of the first lower electrode contact and the second lower electrode contact may be greater than the thickness of the upper electrode.

In some embodiments, the first lower electrode contact and the second lower electrode contact may be separated from the upper electrode. In some embodiments, the lower electrode may be formed from the same material as the gate electrode. In some embodiments, the first lower electrode contact may be formed from the same material as the second lower electrode contact. In some embodiments, the first lower electrode contact may have a laminated structure of molybdenum/aluminum/molybdenum (Mo/Al/Mo). In some embodiments, the organic light emitting diode display device may further include: a power line formed in the same layer as the gate electrode; a first power line contact formed in the same layer as the drain electrode and the source electrode and electrically connected to the power line; and a second power line contact formed on the first power line contact. In some embodiments, the second power line contact may be formed from the same material as the drain electrode and the source electrode. In some embodiments, the first power line contact and the second power line contact may have a laminated structure of molybdenum/aluminum/molybdenum (Mo/Al/Mo).

In another aspect, a method for manufacturing an organic light emitting diode display device includes, for example, forming an active layer and a gate electrode in a transistor region of a substrate, forming a pixel electrode and an electrode pattern in a light emitting region of the substrate, forming an insulating layer over the substrate to at least partially cover the electrode pattern and the gate electrode, forming a plurality of openings exposing a part of the electrode pattern and parts of source/drain regions of the active layer, forming a first conductive layer over the substrate to fill the plurality of openings, forming a pixel electrode contact contacting with the electrode pattern by etching the first conductive layer and the electrode pattern to partially expose the pixel electrode and the source/drain regions, forming a second conductive layer over the substrate to at least partially cover the pixel electrode contact, and forming a drain electrode and a source electrode by etching the second conductive layer.

In some embodiments, the drain electrode may contact the drain region and may be formed on the pixel electrode contact. In some embodiments, the first and second conductive layers may have a laminated structure of molybdenum/aluminum/molybdenum (Mo/Al/Mo).

In another aspect, a method of manufacturing an organic light emitting diode display device includes, for example, forming an active layer and a gate electrode in a transistor region of a substrate, forming a pixel electrode and an electrode pattern in a light emitting region of the substrate, forming a lower electrode in a storage region of the substrate, forming an insulating layer over the substrate to cover the electrode pattern, the gate electrode, and the lower electrode, and forming a plurality of openings exposing a part of the electrode pattern, parts of source/drain regions of the active layer, and a part of the lower electrode, forming a first conductive layer over the substrate to fill the plurality of openings, forming a pixel electrode contact contacting the electrode pattern and forming a first lower electrode contact by etching the first conductive layer and the electrode pattern to at least partially expose the pixel electrode, the source/drain regions, and the lower electrode, forming a second conductive layer over the substrate to cover the pixel electrode contact and the first lower electrode contact, forming a drain electrode and a source electrode in the transistor region, and etching the second conductive layer to form an upper electrode and a second lower electrode contact on the first lower electrode contact in the storage region.

In some embodiments, the drain electrode and the source electrode may be formed in the same layer as the upper electrode. In some embodiments, a sum of thicknesses of the first lower electrode contact and the second lower electrode contact may be greater than the thickness of the upper electrode.

BRIEF DESCRIPTION OF THE DRAWINGS

Features of the present disclosure will become more fully apparent from the following description and appended claims, taken in conjunction with the accompanying drawings. It will be understood these drawings depict only certain embodiments in accordance with the disclosure and, therefore, are not to be considered limiting of its scope; the disclosure will be described with additional specificity and detail through use of the accompanying drawings. An apparatus, system or method according to some of the described embodiments can have several aspects, no single one of which necessarily is solely responsible for the desirable attributes of the apparatus, system or method. After considering this discussion, and particularly after reading the section entitled "Detailed Description of Certain Inventive Embodiments" one will understand how illustrated features serve to explain certain principles of the present disclosure.

DETAILED DESCRIPTION OF CERTAIN INVENTIVE EMBODIMENTS

Figure 1:
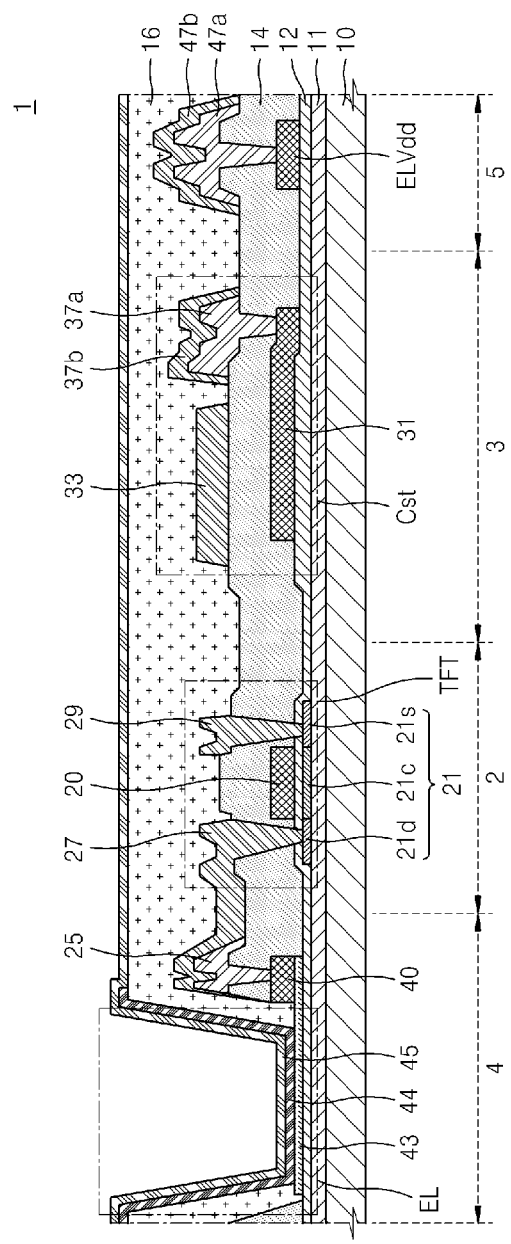
FIG. 1 is a schematic cross-sectional view illustrating a structure of an organic light emitting diode display device according to an embodiment of the present disclosure.

The present invention may be variously modified and may include various embodiments. Particular embodiments are exemplarily illustrated in the drawings and will be described in detail. However, it should be understood that the particular embodiments are not intended to limit the present disclosure to specific forms, but rather the present disclosure is meant to cover all modifications, similarities, and alternatives, which are included in the spirit and scope of the present disclosure. Detailed descriptions of well-known functions or configurations will be omitted in order not to unnecessarily obscure the focus of the present invention. Relational terms such as first, second, and the like may be used for describing various elements, but the elements should not be limited by the terms. The terms are used solely for distinguishing one element from another. The terminology used herein is not for delimiting the disclosure, but for describing the specific embodiments. The terms of a singular form may include plural forms unless otherwise specified. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Hereinafter, preferred embodiments will be described in detail with reference to the accompanying drawings.

FIG. 1 is a schematic cross-sectional view illustrating a structure of an organic light emitting diode display device 1 according to an embodiment of the present disclosure. Referring to FIG. 1, the organic light emitting diode display device 1 includes a transistor region 2, a storage region 3, a light emitting region 4, and a power line region 5.

The transistor region 2 includes a thin film transistor (TFT) as a driving element. The TFT includes an active layer 21, a gate electrode 20, and source/drain electrodes 29 and 27. A first insulating layer 12, which is a gate dielectric, is disposed between the gate electrode 20 and the active layer 21 for insulation therebetween. Source/drain regions 21s and 21d doped with high-concentration impurities are formed on both sides of the active layer 21, and are respectively connected to the source/drain electrodes 29 and 27.

A capacitor Cst is formed in the storage region 3. The capacitor Cst includes a lower electrode 31 and an upper electrode 33, and a second insulating layer 14 is disposed therebetween. The lower electrode 31 is formed on the first insulating layer 12. The lower electrode 31 includes a semiconductor material, and is doped with impurities to have improved electrical conductivity. The capacitor upper electrode 33 may be formed in the same layer and by using the same material as that for forming the source/drain electrodes 29 and 27 of the TFT, and a pixel electrode 43 of an organic light emitting element (EL).

According to the embodiment, the lower electrode 31 is electrically connected to a first lower electrode contact 37a and a second lower electrode contact 37b formed on the first lower electrode contact 37a.

Therefore, by forming a double wiring structure of the first and second lower electrode contacts 37a and 37b on the lower electrode 31, an IR drop due to a large size of a panel may be prevented and a fast response speed of an organic light emitting diode display device may be achieved by reducing the resistance of the first and second lower electrode contacts 37a and 37b.

In the storage region 3, thicknesses of the first and second lower electrode contacts 37a and 37b electrically connected to the lower electrode 31 may be different from the thickness of the upper electrode 33. Therefore, a short circuit between the upper electrode 33 and the first and second lower electrode contacts 37a and 37b may be prevented, and also a process margin for preventing the short circuit may be secured while forming the first and second lower electrode contacts 37a and 37b on the lower electrode 31.

The organic light emitting element EL is provided in the light emitting region 4. The organic light emitting element EL includes the pixel electrode 43 connected to one of the source/drain electrodes 29 and 27 of the TFT, an opposite electrode 45 opposing the pixel electrode 43, and an intermediate layer 44 disposed between the pixel electrode 43 and the opposite electrode 45. The pixel electrode 43 may be formed from a transparent conductive material and in the same layer by using the same material as that for forming the source/drain electrodes 29 and 27 of the TFT.

According to the embodiment, a pixel electrode contact 25 formed on the pixel electrode 43 is electrically connected to the drain electrode 27.

Therefore, by forming a double wiring structure of the pixel electrode contact 25 and the drain electrode 27 on the pixel electrode 43, an IR drop due to a large size of a panel may be prevented and a fast response speed may be achieved by reducing the resistance of the pixel electrode contact 25 and the drain electrode 27.

Further, by depositing the wiring on the pixel electrode 43 partially in a double layer and by forming the source/drain electrodes 29 and 27 on the active layer 21 with a single wiring, a process margin for preventing a short circuit may be secured while the source/drain electrodes 29 and 27 on the active layer 21 are formed.

The power line region 5 includes a power line ELVdd and first and second power line contacts 47a and 47b formed on the power line ELVdd. The first and second power line contacts 47a and 47b may be formed from the same material as the source/drain electrodes 29 and 27 of the TFT, the capacitor upper electrode 33, and the pixel electrode contact 25 of the organic light emitting element EL. According to the embodiment, the power line ELVdd formed in the power line region 5 is electrically connected to the first and second power line contacts 47a and 47b.

Therefore, by forming a double wiring structure of the first and second power line contacts 47a and 47b on the power line ELVdd, an IR drop due to a large size of a panel may be prevented and a fast response speed of an organic light emitting diode display device may be achieved by reducing the resistance of the first and second power line contacts 47a and 47b.

FIGS. 2 to 14 are schematic cross-sectional views illustrating a method of manufacturing the organic light emitting diode display device 1 illustrated in FIG. 1. Hereinafter, the manufacturing process of the organic light emitting diode display device 1 illustrated in FIG. 1 will be briefly described.

Figure 2:
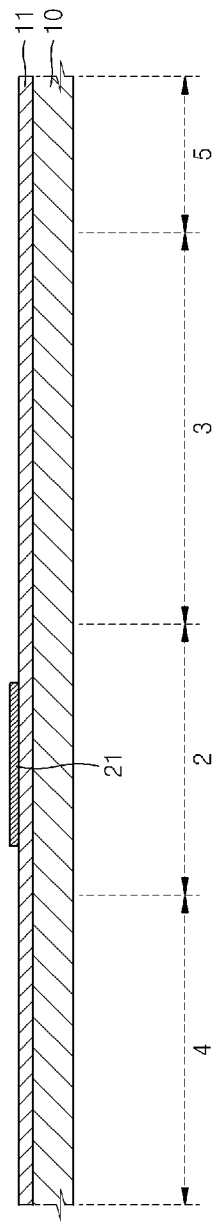
FIGS. 2 to 14 are schematic cross-sectional views illustrating a method of manufacturing the organic light emitting diode display device illustrated in FIG. 1.

As illustrated in FIG. 2, an auxiliary layer 11 is formed on a substrate 10. In some embodiments, the substrate 10 may be formed from transparent glass mainly composed of $SiO_2$. The substrate 10 is not necessarily limited thereto, and may be formed from another material such as transparent plastic or metal. The auxiliary layer 11 such as a barrier layer, a blocking layer, and/or a buffer layer may be provided to an upper surface of the substrate 10 to prevent diffusion of impurity ions, prevent infiltration of moisture or air, and planarize a surface. The buffer layer 11 may be formed by various deposition methods such as plasma enhanced chemical vapor deposition (PECVD), atmospheric pressure CVD (APCVD), and low pressure CVD (LPCVD) using $SiO_2$ and/or $SiN_x$.

The active layer 21 of the TFT is formed on the auxiliary layer 11. In some embodiments, an amorphous silicon layer (not illustrated) is deposited on the auxiliary layer 11, and then is crystallized to thereby form a polycrystal silicon layer (not illustrated). The amorphous silicon may be crystallized using various methods such as a rapid thermal annealing (RTA) method, a solid phase crystallization method (SPC), an excimer laser annealing (ELA) method, a metal induced crystallization (MIC) method, a metal induced lateral crystallization (MILC) method, and a sequential lateral solidification (SLS) method. The polycrystal layer is patterned to the active layer 21 of the TFT by a mask process using a first mask (not illustrated).

Figure 3:
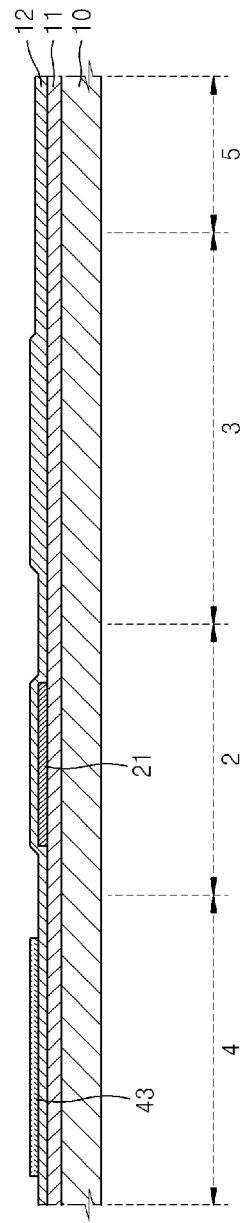

Next, as illustrated in FIG. 3, the first insulating layer 12 is formed over the substrate 10 on which the active layer 21 is formed. For the first insulating layer 12, an inorganic insulating layer of $SiN_x$ or $SiO_x$ may be deposited using the PECVD, APCVD, or LPCVD method. The first insulating layer 12 is disposed between the active layer 21 and the gate electrode 20 (see FIG. 1) of the TFT to serve as a gate dielectric of the TFT, and is disposed between the upper electrode 33 (see FIG. 1) and the lower electrode 31 (see FIG. 1) of the capacitor to serve as a dielectric layer of the capacitor Cst.

Next, the pixel electrode 43 of the light emitting region (PXL) is formed on the first insulating layer 12. The pixel electrode 43 has a multilayer structure including a metal layer and conductive oxide films disposed on and under the metal layer. The pixel electrode 43 may be formed from at least one selected from ITO/Ag/ITO, ITO/Ag/IZO (indium zinc oxide), ATD (ITO/Ag alloy/ITO), ITO/APC (Ag—Pd—Cu alloy)/ITO, and an equivalent thereof. The layers of the pixel electrode 43 may be sequentially laminated using a vacuum deposition or sputtering method, and then may be simultaneously etched and patterned using photolithography. An etchant solution may include nitric acid or acetic acid.

Figure 4:
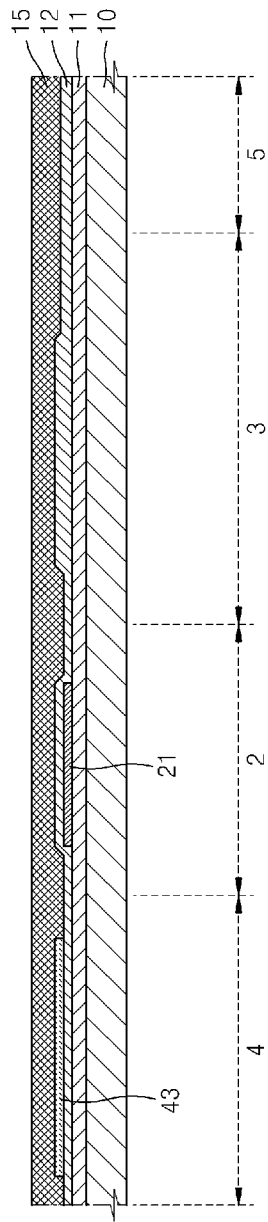

Next, as illustrated in FIG. 4, a first conductive layer 15 is formed over the substrate 10 on which the pixel electrode 43 is formed. The first conductive layer 15 may include at least one material selected from Ag, Mg, Al, Pt, Pd, Au, Ni, Nd, Ir, Cr, Li, Ca, Mo, Ti, W, MoW, and Al/Cu. For example, in some embodiments the first conductive layer 15 may have a 3-layer structure of Mo/Al/Mo.

Figure 5:
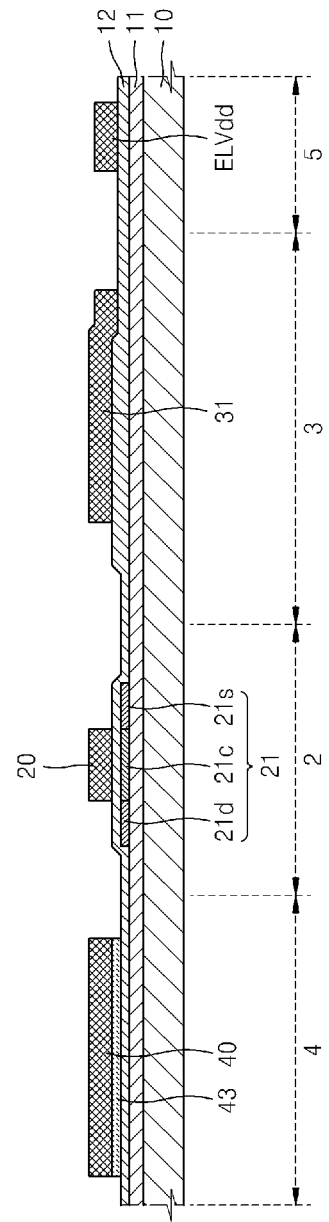

Next, as illustrated in FIG. 5, the gate electrode 20, an electrode pattern 40, the lower electrode 31, and the power line ELVdd are formed on the substrate 10. In some embodiments, the second electrode layer 15 laminated over the pixel electrode 43 and the substrate 10 is patterned to the electrode pattern 40 by a mask process using a second mask (not illustrated). The gate electrode 20 is formed on the active layer 21 in the transistor region 2. The gate electrode 20 is formed to correspond to a center of the active layer 21. Using the gate electrode 20 as a self-aligning mask, the active layer 21 is doped with n-type or p-type impurities to form the source/drain regions 21s and 21d on both sides of the active layer 21 which correspond to both sides of the gate electrode 20, and form a channel region 21c between the source/drain regions 21s and 21d. The impurities may be boron (B) or phosphorus ions. The capacitor lower electrode 31 is formed in the storage region 3. The power line ELVdd is formed in the power line region 5.

Figure 6:
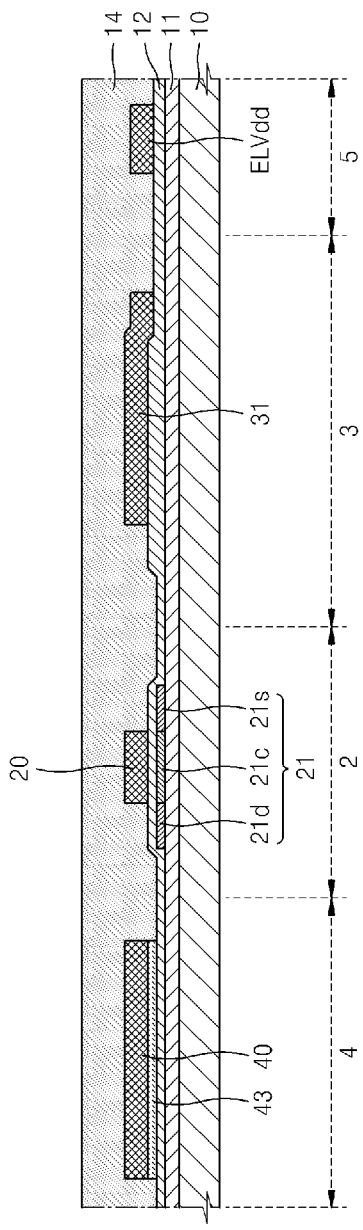

Next, as illustrated in FIG. 6, the second insulating layer 14 is deposited over the substrate 10 on which the gate electrode 20 is formed. The second insulating layer 14 is formed by performing spin coating using at least one organic insulating material selected from the group including, for example, polyimide, polyamide, acryl resin, benzocyclobutene, and phenol resin. The second insulating layer 14 is formed to a sufficiently great thickness, for example, to a thickness greater than that of the first insulating layer 12, to serve as an interlayer dielectric between the gate electrode 20 and source/drain electrodes (not illustrated). The second insulating layer 14 may be formed not only of the organic insulating material but also of the same inorganic insulating material as the first insulating layer 12. Alternatively, the organic insulating material and the inorganic insulating material may be alternated to form the second insulating layer 14.

Figure 7:
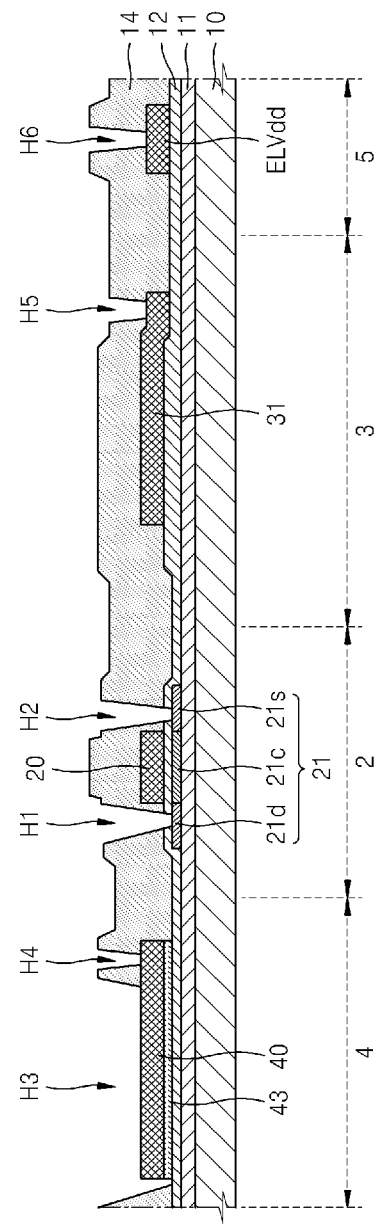

Next, as illustrated in FIG. 7, openings H1 to H6 that partially expose the source/drain regions 21s and 21d of the active layer 21, the electrode pattern 40, the lower electrode 31 of the capacitor, and the power line ELVdd are formed by patterning the second insulating layer 14. In some embodiments, the second insulating layer 14 is patterned by a mask process using a third mask (not illustrated) to form the openings H1 to H6. The first and second openings H1 and H2 partially expose the source/drain regions 21s and 21d respectively, the third and fourth openings H3 and H4 partially expose the electrode pattern 40, the fifth opening H5 exposes at least a part of the capacitor lower electrode 31, and the sixth opening H6 exposes at least a part of the power line ELVdd.

Figure 8:
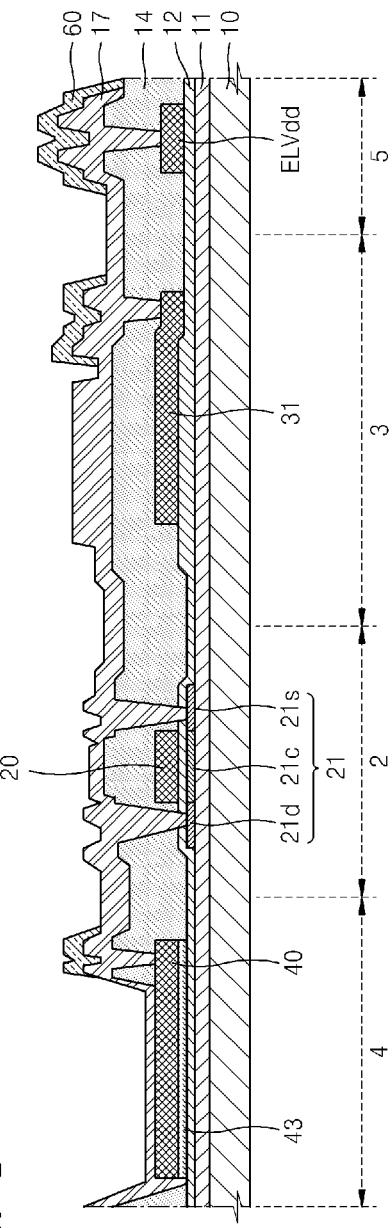

Next, as illustrated in FIG. 8, a second conductive layer 17 is deposited over the substrate 10 to cover the second insulating layer 14. A material of the second conductive layer 17 may be selected from the above-mentioned conductive materials of the first conductive layer 15. However, the material of the second conductive layer 17 is not limited thereto, and thus, the second conductive layer 17 may be formed from various conductive materials. For example, in some embodiments the second conductive layer 17 may have an aluminum single layer structure, a copper single layer structure, or a laminated structure of aluminum layer/molybdenum layer (Al/Mo structure), molybdenum layer/aluminum layer/molybdenum layer (Mo/Al/Mo structure), molybdenum layer/aluminum layer (Mo/Al structure), or titanium layer/copper layer (Ti/Cu structure). The conductive material is deposited to a sufficient thickness to fill the openings H1 to H6.

Next, a photoresist material is applied on the second conductive layer 17. The photoresist material is a photosensitive polymer and includes a light-reactive material. The photoresist material may include a solvent, a hydrocarbon polymer, and a photoactive agent (PAC). The photoresist material may be generally classified into two types, for example, a negative type and a positive type. Regarding the negative type photoresist material, a part that receives light is hardened and the other part is developed. Regarding the positive type photoresist material, a part that receives light is melted. After applying the photoresist material, the photoresist material is exposed by a mask process using a fourth mask (not illustrated) and an exposure device such as a stepper. When using a positive photoresist, a light-exposed photoresist is developed to form a photoresist layer 60 having a pattern according to a part of the fourth mask which is not an opening of the fourth mask. When using a negative photoresist, a light-exposed photoresist is developed to form the photoresist layer 60 having a pattern according to the opening of the fourth mask. Thus, the fourth mask remains only in a place where a wiring having a double-deposited structure is formed.

Figure 9:
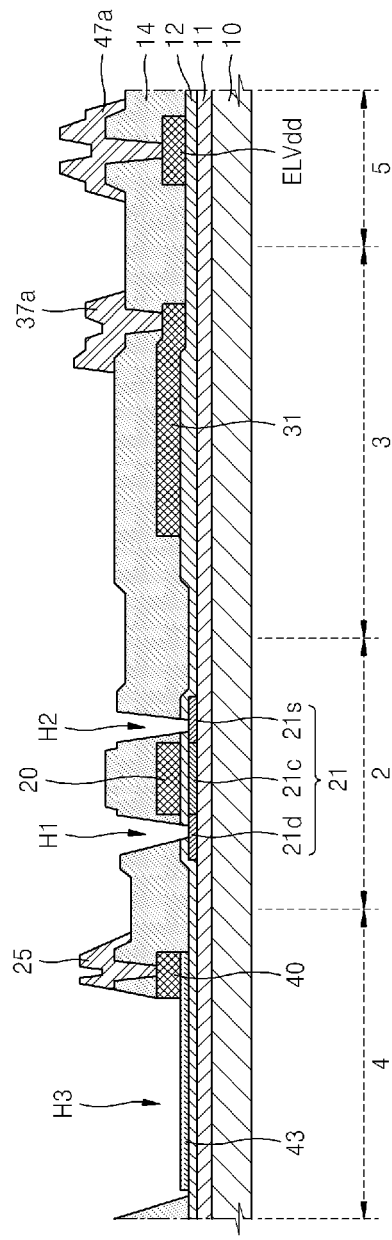

Next, as illustrated in FIG. 9, by etching the second conductive layer 17 (see FIG. 8) and the electrode pattern 40 (see FIG. 8) using the remaining photoresist layer 60, the source/drain regions 21s and 21d are partially exposed, and the pixel electrode contact 25, the first lower electrode contact 37a, and the first power line contact 47a are formed. The pixel electrode contact 25 is formed through the fourth opening H4, and is electrically connected to the pixel electrode 43 via the electrode pattern 40 (see FIG. 8). The first lower electrode contact 37a is formed to be electrically connected to the lower electrode 31 of the capacitor through the fifth opening H5. The first power line contact 47a is formed to be electrically connected to the power line ELVdd through the sixth opening H6.

Figure 10:
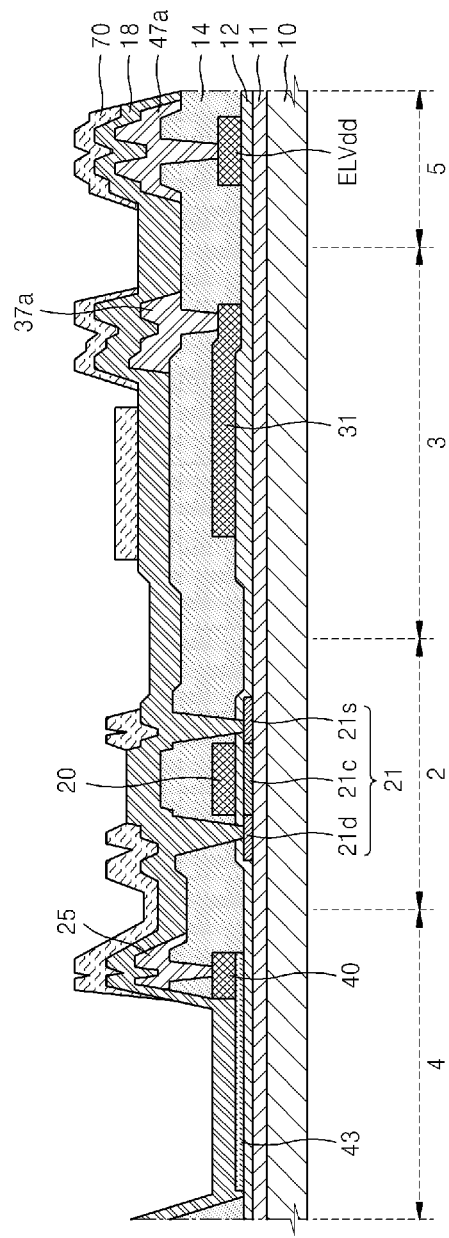

Next, as illustrated in FIG. 10, a third conductive layer 18 is deposited over the substrate 10 to cover the second insulating layer 14, the pixel electrode 25, the first lower electrode contact 37a, and the first power line contact 47a. A material for forming the third conductive layer 18 may be selected from the above-mentioned conductive materials for forming the second conductive layer 17. However, the material for forming the third conductive layer 18 is not limited thereto, and thus, the third conductive layer 18 may be formed from various conductive materials. For example, in some embodiments the third conductive layer 18 may have an aluminum single layer structure, a copper single layer structure, or a laminated structure of aluminum layer/molybdenum layer (Al/Mo structure), molybdenum layer/aluminum layer/molybdenum layer (Mo/Al/Mo structure), molybdenum layer/aluminum layer (Mo/Al structure), or titanium layer/copper layer (Ti/Cu structure). The conductive material is deposited to a sufficient thickness to fill the first to third holes H1 to H3 (see FIG. 9).

Next, a photoresist material is applied on the third conductive layer 18. After applying the photoresist material, the photoresist material is exposed by a mask process using a fifth mask (not illustrated) and using an exposure device such as a stepper. When using a positive photoresist, a light-exposed photoresist is developed to form a photoresist layer 70 having a pattern according to a part of the fifth mask which is not an opening of the fifth mask. When using a negative photoresist, a light-exposed photoresist is developed to form the photoresist layer 70 having a pattern according to the opening of the fifth mask. The fifth mask is used for forming a double-laminated structure by depositing a conductive layer on the pixel electrode contact 25, the first lower electrode contact 37a, and the first power line contact 47a, and for forming the capacitor upper electrode 33 (see FIG. 11) and the source and drain electrodes 29 and 27 (see FIG. 11).

Therefore, the photoresist layer 70 is formed on the pixel electrode contact 25, the first lower electrode contact 37a, and the first power line contact 47a, and in a place where the capacitor upper electrode 33 (see FIG. 11) and the source and drain electrodes 29 and 27 (see FIG. 11) are to be formed.

Figure 11:
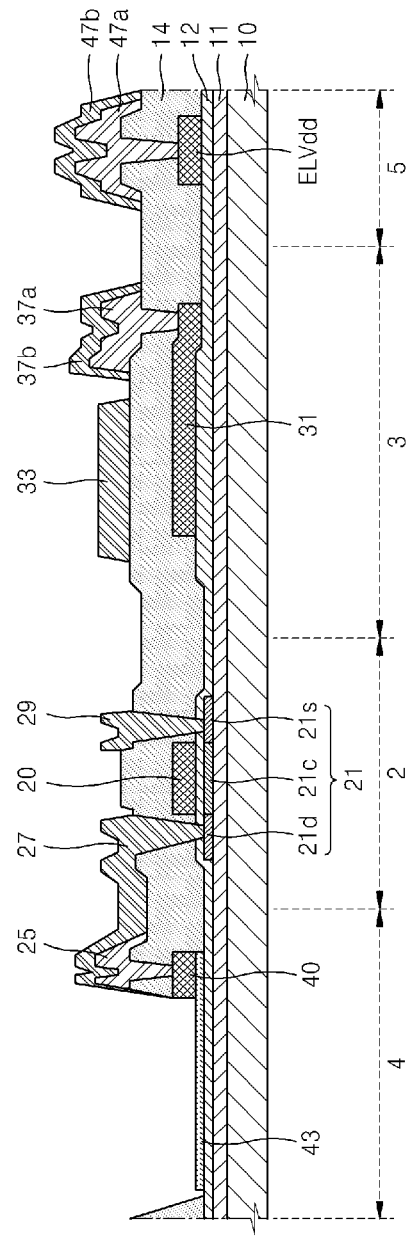

Next, as illustrated in FIG. 11, the drain electrode 27 on the pixel electrode contact 25, the source electrode 29, the capacitor upper electrode 33, the second lower electrode contact 37b on the first lower electrode contact 37a, and the second power line contact 47b on the first power line contact 47a are formed by etching the third conductive layer 18 (see FIG. 10) using the remaining photoresist layer 70 as a mask. The drain electrode 27 and the pixel electrode 43 are electrically connected to each other through the pixel electrode contact 25, and the pixel electrode contact 25 and the drain electrode 27 are formed in a double layer on the pixel electrode 43. Therefore, the resistance of may be reduced by thickening a wiring, and thus, the organic light emitting diode display device 1 may have a fast response speed. Considering the resolution of the photolithography equipment, the drain electrode 27 and the source electrode 29 may be selectively formed to be a single layer instead of a double layer.

Figure 12:
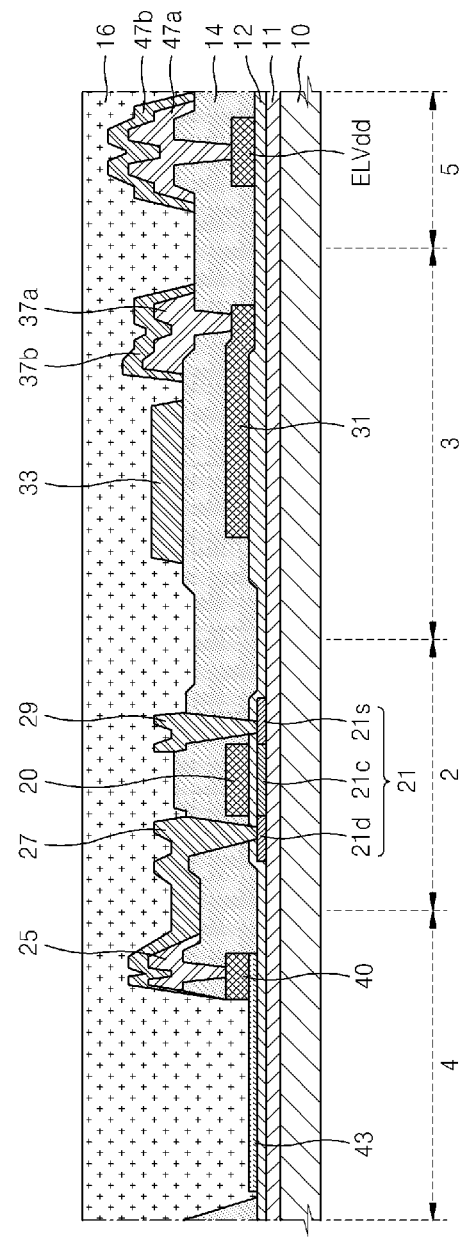

Next, as illustrated in FIG. 12, a third insulating layer 16 is formed on the substrate 10. In some embodiments, the third insulating layer 16 is formed to a sufficiently great thickness over the substrate 10 on which the pixel electrode 43, the source/drain electrodes 29 and 27, the capacitor upper electrode 33, and the second power line contact 47b are formed. The third insulating layer 16 may be formed by performing spin coating using at least one organic insulating material selected from the group including, for example, polyimide, polyamide, acryl resin, benzocyclobutene, and phenol resin. The third insulating layer 16 may be formed from not only the organic insulating material but also an inorganic insulating material selected from $SiO_2$, $SiN_x$, $Al_2O_3$, $CuOx$, $Tb_4O_7$, $Y_2O_3$, $Nb_2O_5$, and $Pr_2O_3$. The third insulating layer 16 may be formed to have a multilayer structure in which the organic insulating material and the inorganic insulating material are alternated.

Figure 13:
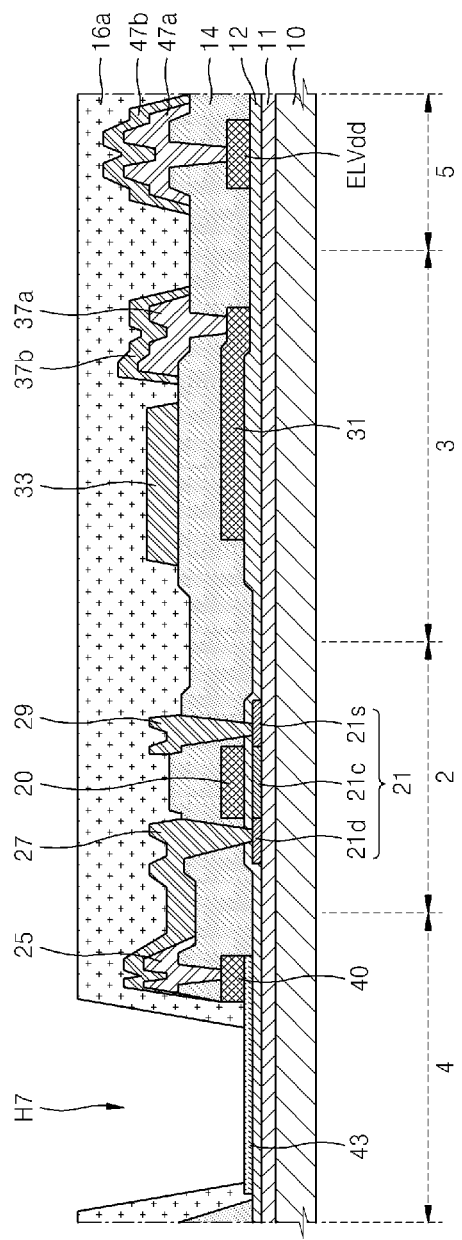

Next, as illustrated in FIG. 13, a pixel defining film 16a is formed by patterning the third insulating layer 16. The patterning is carried out by a mask process using a sixth mask (not illustrated) to form the opening H7 that exposes a central part of the pixel electrode 43, whereby the pixel defining film 16a defines a pixel.

Figure 14:
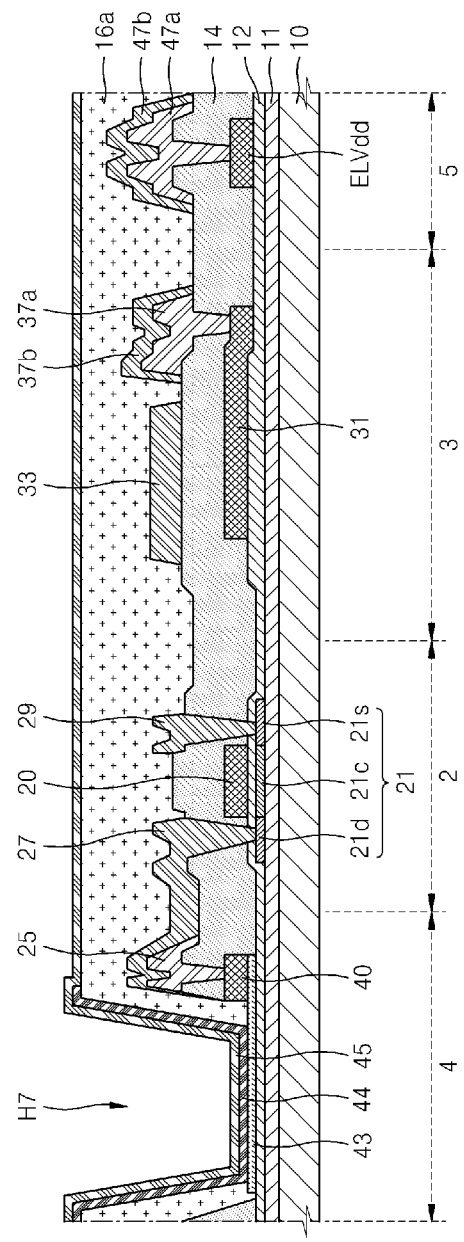

Finally, as illustrated in FIG. 14, the intermediate layer 44 including the light emitting layer and the opposite electrode 45 are formed in the opening H7 that exposes the pixel electrode 43. The intermediate layer 44 may be formed by laminating an organic emissive layer (EML) and at least one of function layers such as a hole transport layer (HTL), a hole injection layer (HIL), an electron transport layer (ETL), and an electron injection layer (EIL) in a single or complex structure. The intermediate layer 44 may be formed from a low molecular or polymeric organic material.

In this case, the hole transport layer and the hole injection layer are laminated in a direction of the pixel electrode 43 with respect to the organic emissive layer and the electron transport layer and the electron injection layer are laminated in a direction of the opposite electrode 45. Various layers may be additionally laminated as necessary. Copper phthalocyanine (CuPc), N,N'-Di(naphthalene-1-yl)-N,N'-diphenyl-benzidine (NPB), tris-8-hydroxyquinoline aluminum (Alq3), or the like may be used as the organic material.

When using the polymeric organic material, the intermediate layer 44 may include only the hole transport layer in a direction of the pixel electrode 43 with respect to the organic emissive layer. The hole transport layer may be formed on the pixel electrode 43 by performing inkjet printing or spin coating by using poly-(2,4)-ethylene-dihydroxy thiophene (PEDOT) or polyaniline (PANT). Regarding the organic material, poly-phenylenevinylene (PPV)-based or polyfluorene-based polymeric organic material may be used, and a color pattern may be formed by a typical method such as inkjet printing, spin coating, or thermal printing using laser.

The opposite electrode 45 may be deposited over the substrate 10 to be formed as a common electrode. In the organic light emitting diode display device 1 according to the present embodiment, the pixel electrode 43 may be an anode electrode and the opposite electrode 45 may be a cathode electrode. However, the polarities of the electrodes may be reversed.

If the organic light emitting diode display device 1 is a bottom emission type in which an image is formed toward the substrate 10, the pixel electrode 43 is a transparent electrode and the opposite electrode 45 is a reflective electrode. The reflective electrode may be formed by thinly depositing a metal with a low work function, for example, Ag, Mg, Al, Pt, Pd, Au, Ni, Nd, Ir, Cr, Li, Ca, LiF/Ca, and LiF/Al, or a compound thereof.

While performing each mask process for forming the organic light emitting diode display device 1, removal of a laminated film may be performed by dry or wet etching.

Although the organic light emitting diode display device 1 has been described in the above-mentioned embodiment, the disclosure is not limited thereto. Therefore, various display devices including a liquid crystal display device may be covered by the scope of the present disclosure.

Although only one TFT and one capacitor are illustrated in the drawings, this is just for convenience and the present disclosure is not limited thereto. Thus, a plurality of TFTs and a plurality of capacitors may be included in the organic light emitting diode display device 1, and the number thereof may be increased by increasing the number of the mask processes.

While the present invention has been particularly shown and described with reference to exemplary embodiments thereof, it will be appreciated by those skilled in the art that various modifications and changes may be made without departing from the scope of the present disclosure. It will also be appreciated by those of skill in the art that parts included in one embodiment are interchangeable with other embodiments; one or more parts from a depicted embodiment can be included with other depicted embodiments in any combination. For example, any of the various components described herein and/or depicted in the Figures may be combined, interchanged or excluded from other embodiments. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. Thus, while the present disclosure has described certain exemplary embodiments, it will be understood by those of ordinary skill in the art that various changes in form and details may be made therein without departing from the spirit and scope of the present invention as defined by the following claims.

What is claimed is:

1. An organic light emitting diode display device, comprising:
    a substrate;
    a thin film transistor comprising an active layer on the substrate, a gate electrode, a source electrode, and a drain electrode;
    a pixel electrode formed in a layer below the layer of the gate electrode;
    an electrode pattern at least partially exposing the pixel electrode and formed on the pixel electrode;
    a pixel electrode contact formed between the electrode pattern and the drain electrode and electrically connected to the drain electrode;
    a pixel defining film exposing the pixel electrode and formed to cover the drain electrode and the source electrode;
    an intermediate layer formed on the exposed pixel electrode and comprising an emissive layer; and
    an opposite electrode formed opposite the pixel electrode and formed covering the intermediate layer.

2. The organic light emitting diode display device of claim 1, wherein the pixel electrode contact contacts both an upper part of the electrode pattern and a lower part of the drain electrode.

3. The organic light emitting diode display device of claim 1, wherein the drain electrode, the source electrode, and the pixel electrode contact are formed from the same material.

4. The organic light emitting diode display device of claim 1, wherein the pixel electrode contact is formed having a laminated structure of molybdenum/aluminum/molybdenum (Mo/Al/Mo).

5. The organic light emitting diode display device of claim 1, wherein a sum of thicknesses of the pixel electrode contact and the drain electrode on the electrode pattern is greater than the thickness of the drain electrode on the active layer.

6. The organic light emitting diode display device of claim 1, further comprising an auxiliary layer formed between the substrate and the active layer.

7. The organic light emitting diode display device of claim 1, further comprising a capacitor comprising:
    a lower electrode formed in the same layer as the gate electrode;
    an upper electrode formed in the same layer and from the same material as the drain electrode and the source electrode;

a first lower electrode contact formed in the same layer as the upper electrode and electrically connected to the lower electrode; and a second lower electrode contact formed on the first lower electrode contact.

8. The organic light emitting diode display device of claim 7, wherein a sum of thicknesses of the first lower electrode contact and the second lower electrode contact is greater than the thickness of the upper electrode.

9. The organic light emitting diode display device of claim 7, wherein the first lower electrode contact and the second lower electrode contact are separated from the upper electrode.

10. The organic light emitting diode display device of claim 7, wherein the lower electrode is formed from the same material as the gate electrode.

11. The organic light emitting diode display device of claim 7, wherein the first lower electrode contact is formed from the same material as the second lower electrode contact.

12. The organic light emitting diode display device of claim 7, wherein the first lower electrode contact is formed having a laminated structure of molybdenum/aluminum/molybdenum (Mo/Al/Mo).

13. The organic light emitting diode display device of claim 1, further comprising:

a power line formed in the same layer as the gate electrode;

a first power line contact formed in the same layer as the drain electrode and the source electrode and electrically connected to the power line; and a second power line contact formed on the first power line contact.

14. The organic light emitting diode display device of claim 13, wherein the second power line contact is formed from the same material as the drain electrode and the source electrode.

15. The organic light emitting diode display device of claim 13, wherein the first power line contact and the second power line contact are formed having a laminated structure of molybdenum/aluminum/molybdenum (Mo/Al/Mo).

* * * * *